(12) United States Patent
Lawrow

(10) Patent No.: US 7,693,927 B2
(45) Date of Patent: Apr. 6, 2010

(54) DATA PROCESSING SYSTEM AND METHOD

(75) Inventor: Ivan Lawrow, Sheffield (GB)

(73) Assignee: Jennic Limited, South Yorkshire (GB)

( * ) Notice: Subject to any disclaimer, the term of this patent is extended or adjusted under 35 U.S.C. 154(b) by 948 days.

(21) Appl. No.: 10/647,620

(22) Filed: Aug. 25, 2003

(65) Prior Publication Data

US 2005/0050131 A1 Mar. 3, 2005

(51) Int. Cl.
G06F 15/00 (2006.01)
H03M 13/00 (2006.01)

(52) U.S. Cl. .................................. 708/492; 714/781

(58) Field of Classification Search ............. 708/491, 708/492; 714/782
See application file for complete search history.

(56) References Cited

U.S. PATENT DOCUMENTS

| | | | | |
|---|---|---|---|---|
| 4,611,333 A | | 9/1986 | McCallister et al. ............ 375/1 |
| 6,061,826 A | * | 5/2000 | Thirumoorthy et al. ..... 714/784 |
| 6,092,233 A | | 7/2000 | Yang ........................... 714/784 |
| 6,119,262 A | | 9/2000 | Chang et al. ................. 714/781 |
| 6,131,178 A | | 10/2000 | Fujita et al. .................. 714/784 |
| 6,209,115 B1 | | 3/2001 | Truong et al. ................ 714/784 |
| 6,286,123 B1 | | 9/2001 | Kim ............................ 714/781 |
| 6,374,383 B1 | * | 4/2002 | Weng .......................... 714/781 |
| 6,493,845 B1 | * | 12/2002 | Shen et al. ................... 714/784 |
| 7,003,715 B1 | * | 2/2006 | Thurston ..................... 714/782 |
| 7,051,267 B1 | * | 5/2006 | Yu et al. ...................... 714/784 |

FOREIGN PATENT DOCUMENTS

| | | |
|---|---|---|
| JP | 11274940 | 8/1999 |
| TW | 417360 | 1/2001 |
| WO | WO 89/02123 | 3/1989 |
| WO | WO 99/09694 | 2/1999 |
| WO | WO 00/28668 | 5/2000 |
| WO | WO 00/57561 | 9/2000 |

* cited by examiner

*Primary Examiner*—Chuong D Ngo
(74) *Attorney, Agent, or Firm*—Wilmer Cutler Pickering Hale & Dorr LLP

(57) ABSTRACT

Embodiments of the present invention relate to a data processing system comprising a first arithmetic unit comprising at least one finite field multiplier and at least one finite field adder for selectively performing at least two finite field arithmetic calculations; the data processing system comprising means to use a previous finite field arithmetic calculation result in a current finite field arithmetic calculation to determine at least part of a polynomial.

22 Claims, 5 Drawing Sheets

DATA PROCESSING SYSTEM AND METHOD

FIELD OF THE INVENTION

The present invention relates to a data processing system and method and, more particularly, to such a system and method for solving polynomial equations such as, for example, those used in implementing a Berlekamp-Massey algorithm.

BACKGROUND TO THE INVENTION

Modern communication systems use a variety of data processing techniques to ensure that data received at a receiver can be correctly decoded, that is, comprehended. Various forms of error detection and error correction codes have been developed that add redundancy to message symbols that can be used to detect and correct errors in the code word up to a given limit or merely to detect errors up to a larger limit. Bose-Chaudhuri-Hocquenghem (BCH) codes and Reed-Solomon (RS) codes are among the most widely used block codes for communication systems and storage systems. The mathematics underlying BCH and RS codes is explained in, for example, E. R. Berlekamp, *Algebraic Coding Theory*, McGraw-Hill, New York, 1968 and, for example, S. Lin and D. J. Costello, *Error Control Coding: Fundamentals and Applications*, Prentice-Hall, Englewood Cliffs, N-J, 1983, which are incorporated herein by reference for all purposes.

As is well understood within the art an (N, K) BCH or RS code has K message symbols and N coded symbols, where each symbol belongs to $GF(q)$ for a BCH code or $GF(q^m)$ for an RS code. A binary (N, K) BCH code can correct up to t errors with $N=2^m-1$, where N−K is greater than or equal to 2t. An (N, K) RS code can correct t errors and p erasures with $2t+\rho \leq N-K$. For binary BCH codes, an error can be corrected by finding the error locator and error evaluator polynomials. In RS codes, an erasure is defined to be an error with a known error location. The steps performed by most RS decoder architectures for correction of errors can be summarised as follows:
(1) calculate the syndromes for the received code words,
(2) compute the error locator polynomial and the error evaluator polynomial,
(3) find the error locations, and
(4) compute the error values.

If both errors and erasures are corrected, the four steps are modified to be:
(1) calculate the syndromes and Forney syndromes from the received code words and the erasure locations,
(2) compute the errata locator polynomial and the errata evaluator polynomial,
(3) find the errata locations, and
(4) compute the errata value.

In effect, the received data R(x) is provided to a syndrome generator to generate a syndrome polynomial, S(x), which represents the error pattern of the code word from which errors can be corrected. The syndromes depend only on the error pattern, which is part of the syndrome, and not on the transmitted code word. A key equation solver, which uses the well-known Berlekamp-Massey algorithm, is used to generate an error locator polynomial, $\sigma(x)$, and an error evaluator polynomial, $\Omega(x)$. The error locator polynomial, $\sigma(x)$, provides an indication of the locations of any errors. The error evaluator polynomial provides the values of the located errors. Typically, the error locator polynomial is processed by a Chien search engine to generate the roots, $\beta_i^{-1}$, of the polynomial, which roots provide the locations of any errors. The values of the errors are calculated using the roots together with the error evaluator polynomial, $\Omega(x)$.

As is well understood by those skilled in the art there exists various architectures for solving the key equation. Preferred architectures implement an inverse-free Berlekamp-Massey algorithm. Architectures for implementing the algorithm are typically implemented using a parallel processing architecture, which has the disadvantage of requiring the relatively large area and having a relatively high logic circuit delay but with the advantage of a low processing latency. Alternatively, architectures might use a serial processing architecture, which has the disadvantage of a relatively large processing latency but the advantage of a relatively low area and logic delays. However, in the context of a complete decoding system, the increased decoding latency requires increased data buffer sizes that, in turn, require additional space. It will be appreciated by those skilled in the art that the area of any given processing architecture increases significantly as the number of finite field multipliers increases.

It is an object of embodiments of the present invention at least to mitigate some of the problems of the prior art.

SUMMARY OF INVENTION

Accordingly, a first aspect of embodiments of the present invention provides a data processing system comprising a first arithmetic unit comprising at least one finite field multiplier and at least one finite field adder for selectively performing at least two finite field arithmetic calculations; the data processing system comprising means to use a previous finite field arithmetic calculation result of the first arithmetic unit in a current finite field arithmetic calculation of the first arithmetic unit to determine respective coefficients of at least part of at least a first polynomial.

Advantageously, the inverse-free Berlekamp-Massey algorithm according to embodiments of the present invention, when implemented, results in a relatively low area and logic circuit delay as compared to a fully parallel implementation and a lower latency as compared to a fully serial implementation. It will be appreciated that this provides a very good compromise between area and processing latency. In particular, embodiments of the present invention have a very favourable area-latency product as compared with practical implementations of prior art solutions.

Still further, embodiments of the present invention use a relatively low number of finite field multipliers.

Embodiments provide a data processing system in which a first arithmetic operation of the at least two arithmetic operations comprises a first finite field multiplication operation.

Preferably, embodiments provide a data processing system in which the first finite field multiplication operation comprises calculating at least a first multiplication of $\delta\sigma^{(i-1)}(x)$ in a first clock cycle.

Embodiments provide a data processing system in which the first finite field arithmetic operation comprises calculating at least a second multiplication operation of $\Delta^{(i)}x\lambda^{(i-1)}(x)$ in a second clock cycle.

Preferably embodiments provide a data processing system in which a second arithmetic operation of the at least two arithmetic operations comprises a finite field addition operation. Preferably, the finite arithmetic addition operation comprises calculating at least part of $\delta\sigma^{(i-1)}(x)+\Delta^{(i)}x\lambda^{(i-1)}(x)$ as the current finite field arithmetic operation using $\delta\sigma^{(i-1)}(x)$ as at least part of the previous finite field arithmetic operation Embodiments provide a data processing system further comprising at least one further such arithmetic unit operable substantially in parallel with the first arithmetic unit to calculate respective coefficients of at least part of at least a first polynomial. Preferably, the first polynomial comprises at least the coefficients of $\delta\sigma^{(i-1)}(x)+\Delta^{(i)}x\lambda^{(i-1)}(x)$.

Preferred embodiments provide a data processing system in which the at least two arithmetic calculations comprises a second finite field multiplication operation in a third clock cycle. The finite field second multiplication operation comprises calculating at least one coefficient of a second polynomial.

Preferred embodiments provide a data processing system in which the second arithmetic operation comprises calculating at least $S_{i-j+}\sigma_j^{(i)}$. Preferably, the second arithmetic operation comprises calculating at least part of $S_{i+1}\sigma_0^{(i)} S_i\sigma_1^{(i)}+\ldots+S_{i-t+1}\sigma_t^{(i)}$.

Preferred embodiments provide a data processing system comprising at least (t+1) arithmetic units operable substantially in parallel, each unit producing respective coefficients of at least one of a first polynomial, $\sigma^{(i)}(x)=\delta\sigma^{(i-1)}(x)+\Delta^{(i)}x\lambda^{(i-1)}(x)$, and a second polynomial, $\Delta^{(i+1)}=S_{i+1}\sigma_0^{(i)}+\ldots+S_{i-t+1}\sigma_t^{(i)}$.

Embodiments further provide a data processing system in which the first arithmetic unit is arranged to calculate at least a respective part of at least part (coefficients) of a further polynomial. Preferably, the further polynomial is an error evaluator polynomial.

Preferred embodiments provide a data processing system in which the further polynomial comprises calculating $$\Omega(x) = S(x)\sigma(x) \bmod x^{2t}$$
$$= (S_0 + S_1x + \ldots + S_{2t-1}x^{2t-1}) \cdot (\sigma_0 + \sigma_1 x + \ldots + \sigma_t x^t) \bmod x^{2t}$$
$$= \Omega_0 + \Omega_1 x + \ldots + \Omega_{t-1}x^{t-1}, \text{ where}$$
$$\Omega_i = S_i\sigma_0 + S_{i-1}\sigma_1 + \ldots + S_{i-t+1}\sigma_{t-1}, \text{ where } i = 0, 1, \ldots, t-1.$$

Preferably, embodiments provide a data processing system in which the at least a respective part of at least part of the further polynomial comprises calculating:

$\Omega_i^{(j)}=S_i\sigma_0$, for $j=0$; and $\Omega_i^{(j)}=\Omega_i^{(j-1)}+S_{i-j}\sigma_j$, for $1\leq j\leq i$.

Embodiments provide a Berlekamp-Massey algorithm processing unit comprising (t+1) finite field multipliers.

Embodiments also provide a Berlekamp-Massey processing element comprising (t+1) finite field processing units arranged, in a feedback arrangement, to perform at least (t+1) parallel operations; each parallel operation comprising at least two serial operations.

Embodiments provide a Berlekamp-Massey algorithm having an area-latency product of $7t^2+7t$.

BRIEF DESCRIPTION OF THE DRAWINGS

Embodiments of the present invention will now be described, by way of example only, with reference to the accompanying drawings in which.

DETAILED DESCRIPTION OF PREFERRED EMBODIMENTS

The theory underlying embodiments of the present invention will now be described. The key equation for RS(N, K) and BCH(N, K) codes is:

$$S(x)\sigma(x)=\Omega(x) \bmod x^{2t}$$

where $t=(N-K)/2$;

$S(x)=S_{2t-1}x^{2t-1}+S_{2t-2}x^{2t-2}+\ldots+S_0x^0$ is the Syndrome polynomial;

$\sigma(x)=\sigma_t x^t+\sigma_{t-1}x^{t-1}+\ldots+\sigma_0 x^0$ is the error-locator polynomial; and $\Omega(x)=\Omega_{t-1}x^{t-1}+\Omega_{t-2}x^{t-2}+\ldots+\Omega_0 x^0$ is the error-evaluator polynomial.

The inverse-free Berlekamp-Massey Algorithm is a 2t-step iterative algorithm:

$L^{(-1)}=0$;

$\sigma^{(-1)}(x)=1$;

$\lambda^{(-1)}(x)=1$;

$\Delta^{(0)}=S_0$;

$\delta=1$;

---

```
for (i=0; i<2t; i=i+1) {
    σ(i)(x) = δσ(i-1)(x) + Δ(i) xλ(i-1)(x);
    Δ(i+1) = S_{i+1}σ_0(i) + S_iσ_1(i) + ... + S_{i-t+1}σ_t(i);
    if (Δ(i) == 0 || 2L(i-1) ≥ i+1)
        {   L(i) = L(i-1);
            λ(i)(x) = xλ(i-1)(x);
        }
    else
        {   L(i) = i+1 - L(i-1);
            λ(i)(x) = σ(i-1)(x);
            δ = Δ(i);
        }
}
```

--- where:

$\sigma^{(i)}(x)$ is the error-locator polynomial at step i;

$$\lambda^{(i)}(x) = \lambda_t^{(i)}x^t + \lambda_{t-1}^{(i)}x^{t-1} + \ldots + \lambda_0^{(i)}x^0$$

is the auxiliary polynomial at step i;

$\Delta^{(i)}$ is the step discrepancy at step i;

$L^{(i)}$ is the auxiliary degree variable at step i; and $\delta$ is the previous step discrepancy.

Figure 1:
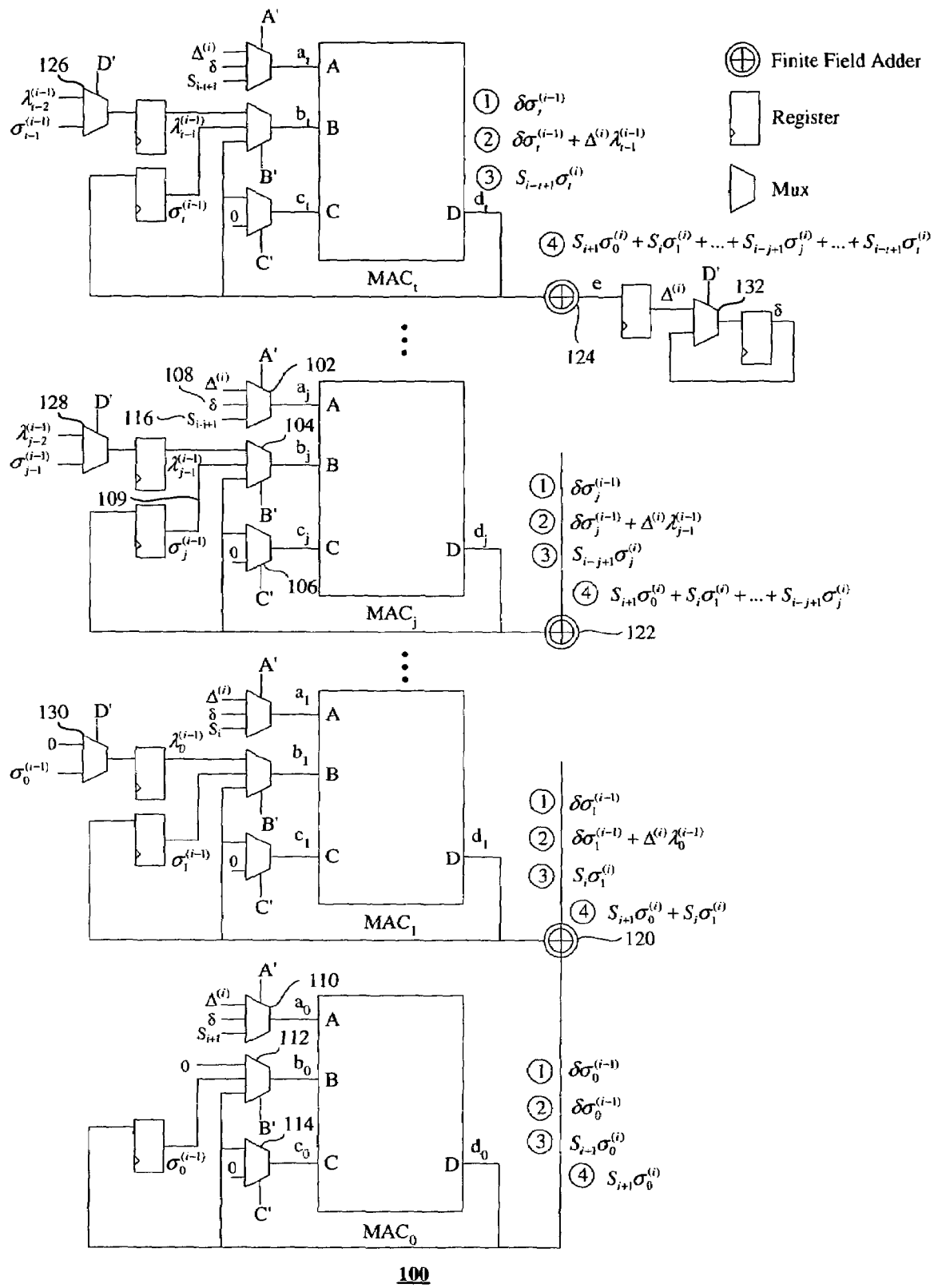
FIG. 1 illustrates an embodiment of the present invention for implementing an inverse-free Berlekamp-Massey algorithm.

Computation of the coefficients of the error-evaluator polynomial, $\Omega(x)$, follows directly after calculating the error-location polynomial, $\sigma(x)$, using $\Omega_i=S_i\sigma_0+S_{i-1}\sigma_1+\ldots+S_{i-t+1}\sigma_{t-1} i=0, 1, \ldots, t-1$ FIG. 1 shows an architecture 100 for implementing an inversion-free Berlekamp-Massey algorithm according to an embodiment of the present invention. The architecture 100 comprises (t+1) multiply and accumulate cells together with associated muliplexers, registers and finite field adders. For the purpose of clarity, only four multiply and accumulate cells $MAC_0$ to $MAC_t$ are shown.

Referring to the $j^{th}$ multiply and accumulate cell $MAC_j$, it can be appreciated that the cell has three inputs; namely, A, B and C, and a single output D for receiving values $a_j$, $b_j$, $c_j$, and producing an output value $d_j$ respectively. The first value, $a_j$, is derived from a multiplexer 102 that selects one of a number of inputs according to a control signal A'. In preferred embodiments, the inputs are the values $\Delta^{(i)}$, $\delta$ and $S_{i-j+1}$. The second input, B, derives its input value, $b_j$, from an associated multiplexer 104. The multiplexer 104 is controlled to select one of a number of inputs according to a control signal B'. In a preferred embodiment, the second multiplexer 104 has three inputs bearing the signals or values $$\lambda_{j-1}^{(i-1)},$$

$\sigma_j^{(i-1)}$, and $d_j$. The third input, C, to the $j^{th}$ multiply and accumulate cell $MAC_j$ preferably derives its input value or input signal, $c_j$, from a third multiplexer 106 having a number of inputs that are selected according to an associated control signal C'. In a preferred embodiment, the input values or signals to the third multiplexer 106 comprise the output from the multiply and accumulate cell $MAC_j$, that is, the signal or value $d_j$ and the value 0.

The multiply accumulate cells $MAC_0$ to $MAC_t$ are used to calculate the error-locator polynomial, $\sigma(x)$, in effect, they are used to calculate $$\sigma^{(i)}(x)=\delta\sigma^{(i-1)}(x)+\Delta^{(i)}x\lambda^{(i-1)}(x),$$

which can be decomposed to $$\sigma_j^{(i)} = \begin{cases} \delta\sigma_0^{(i-1)}, & \text{for } j = 0 \\ \delta\sigma_j^{(i-1)} + \Delta^{(i)}\lambda_{j-1}^{(i-1)} & \text{for } 1 \leq j \leq t \end{cases}$$

$$\Delta_j^{(i+1)} = \begin{cases} S_{i+1}\sigma_0 & \text{for } j = 0 \\ \Delta_{j-1}^{(i+1)} + S_{i-j+1}\sigma_j^{(i)} & \text{for } 1 \leq j \leq t \end{cases}$$

It can be appreciated that the first multiply accumulate cell $MAC_0$ calculates the co-efficient, $\sigma_0^{(i)}$, for the ith iteration of $\sigma^{(i)}(x)$ while the remaining multiply accumulate cells $MAC_1$ to $MAC_t$ calculate the co-efficients $\sigma_1^{(i)}$ to $\sigma_t^{(i)}$ for the remaining 1 to t co-efficients of $\sigma^{(i)}(x)$. The four numerals, 1 to 4, in the circles, together with the adjacent expressions, illustrate the progressive calculation of the various parts of above expressions at corresponding cycles. The first two encircled numerals relate to the calculation of $\sigma_j^{(i)}$. The third and fourth numerals illustrate the progressive calculation or accumulation of $\Delta_j^{(i+1)}$).

The control signals A', B' and C' are arranged in a first cycle to calculate the first term of the expression for $\sigma^{(i)}(x)$ Using the $j^{th}$ multiply and accumulate cell $MAC_j$ as an example, during a first cycle, the first multiplexer 102 is controlled, in response to an appropriate control signal, A', to select the input 108 bearing the signal or data value $\delta$. The second multiplexer 104 is controlled, in response to a respective control signal, B', to select the second input 109 which bears the signal or value $\sigma_j^{(i-1)}$. The third mulitplexer 106 is controlled, in response to an appropriate control signal, C', to select its second input, which bears the value 0.

Figure 2:
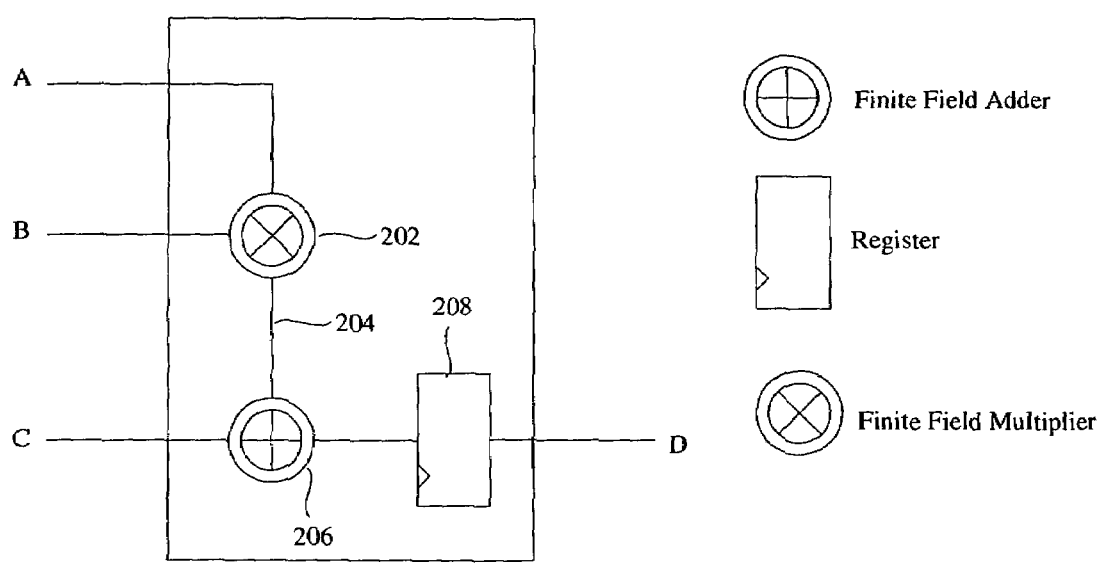
FIG. 2 shows an embodiment of a multiply and accumulate cell.

FIG. 2 shows the internal structure of an embodiment 200 of a multiply and accumulate cell. Each of the multiply and accumulate cells $MAC_0$ to $MAC_t$ has the structure shown in FIG. 2. It can be appreciated that the embodiment 200 shown in FIG. 2 comprises a finite field multiplier 202 arranged to multiply, using pre-determinable modulo arithmetic, the first, A, and second, B, inputs to the multiply accumulate cell 200. In a preferred embodiment, the finite field multiplier performs arithmetic over $GF(q^m)$, and, preferably, over $GF(2^m)$. The output 204 from the finite field multiplier 202 is fed to a finite field adder 206 where it is combined with the value presented at the third input, C, of the multiply and accumulate cell 200. The finite field adder 206 operates over $GF(q^m)$. In preferred embodiments, $GF(q^m)=GF(2^m)$. A register 208 is provided to store the result of the finite field addition operation.

Referring back to FIG. 1 and, in particular, to the $j^{th}$ multiply and accumulate cell $MAC_j$, it can be appreciated, given the control signals A', B' and C' described above, that the $j^{th}$ multiply and accumulate cell $MAC_j$ calculates, in a first cycle, or in the ith cycle, the value $\delta\sigma^{(i-1)}_j$. It can be appreciated that the register 208 is used to store the first part of the calculation of the $j^{th}$ co-efficient of $\sigma^{(i)}(x)$, that is, $\sigma^{(i)}_j = \delta\sigma_j^{(i-1)}$.

During the next, that is, second, cycle, the calculation of $\Delta^{(i)}(x) \lambda^{(i-1)}(x)$ is performed. More particularly, the second part of the calculation of the jth co-efficient of $\sigma^{(i)}(x)$ is performed, that is, $\Delta^{(i)}$ $$\lambda_{j-1}^{(i-1)}$$

is calculated.

The finite field adder is then arranged to add this result, that is, $\Delta^{(i)}\lambda_{j-1}^{(i-1)}$ to $d_j$, which is $\delta\sigma_j^{(i-1)}$, to give $$\sigma_j^{(i)} = \delta\sigma_j^{(i-1)} + \Delta^{(i)}\lambda_{j-1}^{(i-1)}.$$

It will be appreciated that at the end of the second cycle, the value at node $d_j$ forms value $\sigma_j$, that is, $\sigma_j^{(i)}$, for the next cycle.

During the third cycle, the $j^{th}$ multiply and accumulate cell $MAC_j$ is arranged to calculate the $j^{th}$ term, that is, $S_{i-j+1}\sigma_j^{(i)}$. It will be appreciated that the summation of the outputs $d_j$ of each of the multiply accumulate cells $MAC_0$ to $MAC_t$ represents the expression $$\Delta^{(i+1)}=S_{i+1}\sigma_0^{(i)}+S_i\sigma_1^{(i)}+\ldots+S_{i-t+1}\sigma_t^{(i)}.$$

It will be appreciated that since each of the (t+1) terms of this expression are computed in parallel, the calculation takes one clock cycle. Therefore, the embodiments require 3×2t clock cycles to calculate the error—locator polynomial, $\sigma(x)= \sigma_t x^t + \sigma_{t-1} x^{t-1} + \ldots + \sigma_0 x^0$.

TABLE 1

Error-Locator Polynomial Computation Data Flow

| step | i | | | i + 1 | | |
|---|---|---|---|---|---|---|
| cycle | 1 | 2 | 3 | 1 | 2 | 3 |
| $a_j$ | $\delta$ | $\Delta^{(i)}$ | $S_{i-j+1}$ | $\delta$ | $\Delta^{(i+1)}$ | $S_{i-j+2}$ |
| $b_j$ | $\sigma^{(i-1)}_j$ | $\lambda^{(i-1)}_{j-1}$ | $d_j$ | $\sigma^{(i)}_j$ | $\lambda^{(i)}_{j-1}$ | $d_j$ |
| $c_j$ | 0 | $d_j$ | 0 | 0 | $d_j$ | 0 |
| $d_j$ | $S_{i-j}\sigma^{(i-1)}_j$ | $\delta\sigma^{(i-1)}_j$ | $\delta\sigma^{(i-1)}_j + \Delta^{(i)}\lambda^{(i-1)}_{j-1} \equiv \sigma^{(i)}_j$ | $S_{i-j+1}\sigma^{(i)}_j$ | $\delta\sigma^{(i)}_j$ | $\delta\sigma^{(i)}_j + \Delta^{(i+1)}\lambda^{(i)}_{j-1} \equiv \sigma^{(i+1)}_j$ |
| e $\Delta$ | $\Delta^{(i)}$ ... | ... $\Delta^{(i)}$ | ... $\Delta^{(i)}$ | $\Delta^{(i+1)}$ $\Delta^{(i)}$ | ... $\Delta^{(i+1)}$ | ... $\Delta^{(i+1)}$ |
| $\sigma_j$ | $\sigma^{(i-1)}_j$ | $\sigma^{(i-1)}_j$ | $\sigma^{(i-1)}_j$ | $\sigma^{(i)}_j$ | $\sigma^{(i)}_j$ | $\sigma^{(i)}_j$ |
| $\lambda_{j-1}$ | $\lambda^{(i-1)}_{j-1}$ | $\lambda^{(i-1)}_{j-1}$ | $\lambda^{(i-1)}_{j-1}$ | $\lambda^{(i)}_{j-1}$ | $\lambda^{(i)}_{j-1}$ | $\lambda^{(i)}_{j-1}$ |

Figure 3:
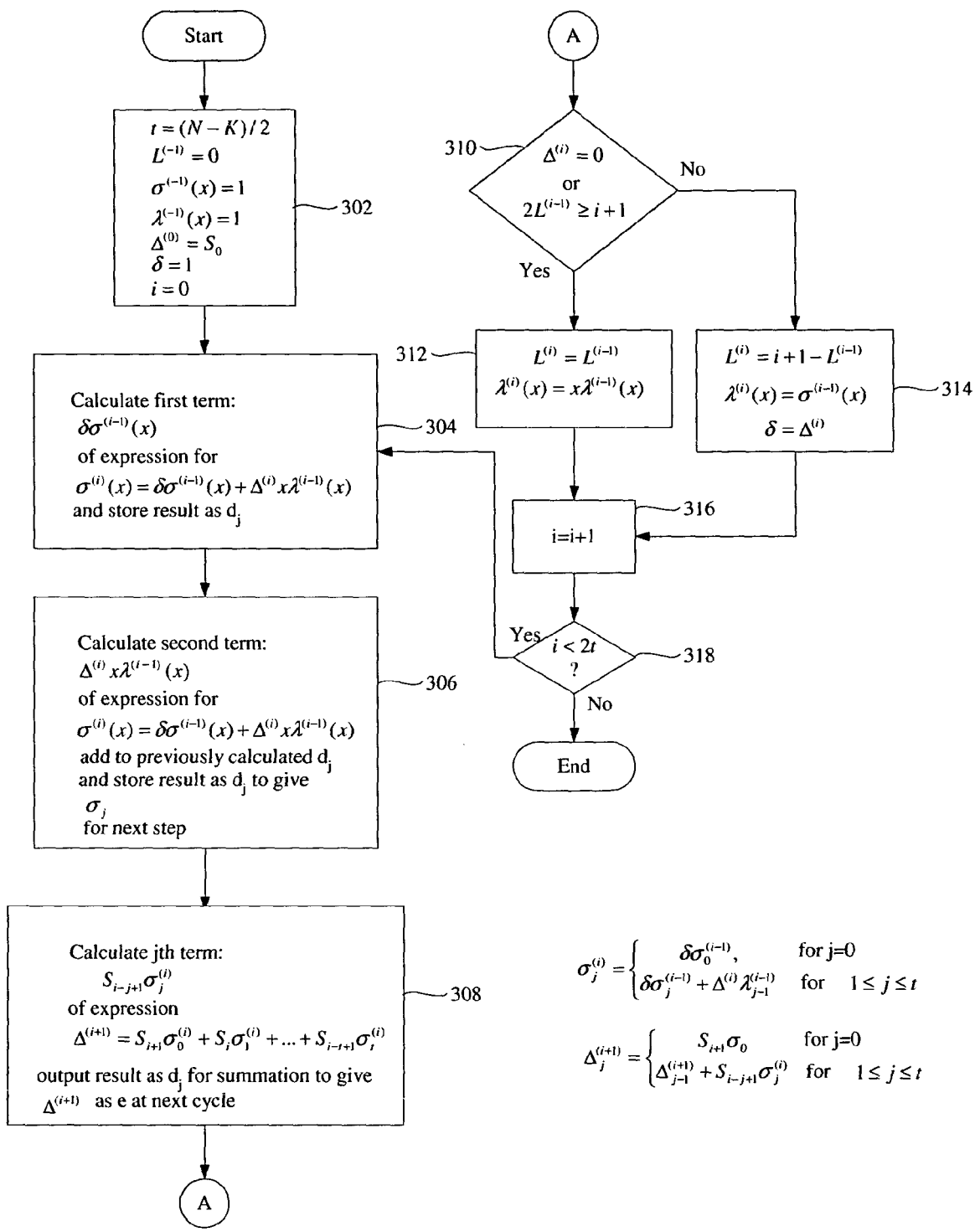
FIG. 3 depicts a flowchart showing the calculations performed using the multiple and accumulate cells of the first embodiment to calculate the error locator polynomial.

Referring to FIG. 3, there is shown a flowchart 300 for calculating the error-locator polynomial according to an embodiment. At step 302, the variables used by the inverse-free Berlekamp-Massey algorithm are initialised. The first term, $\delta\sigma^{(i-1)}(x)$ of the expression $$\sigma^{(i)}(x)=\delta\sigma^{(i-1)}(x)+\Delta^{(i)}x\lambda^{(i-1)(x)}$$

is calculated using each of the multiply and accumulate cells $MAC_0$ to $MAC_t$ at step 304. The overall expression $$\sigma^{(i)}(x)=\delta\sigma^{(i-1)}(x)+\Delta^{(i)}x\lambda^{(i-1)}(x)$$

is calculated at step 306. The multiply accumulate cells $MAC_0$ to $MAC_t$ are used at step 308 to calculate each of the terms of $\Delta^{(i+1)}=S_{i+1}\sigma_0^{(i)}+S_i\sigma_1^{(i)}+\ldots+S_{i-t+1}\sigma_t^{(i)}$. A test is performed, at step 310, to determine if $\Delta^{(i)}=0$ or $2L^{(i-1)}$ is greater than or equal to i+1. If the determination is positive, effect is given to $L^{(i)}=L^{(i-1)}$ and $\lambda^{(i)}(x)=x\lambda^{(i-1)}(x)$ at step 312. If the determination at step 310 is negative, effect is given to $L^{(i)}=i+1-L^{(i-1)}$; $\lambda^{(i)}(x)=\sigma^{(i-1)}(x)$; and $\delta=\Delta^{(i)}$ at step 314. It will be appreciated that effect is given to steps 312 and 314 using the control signals, D', to corresponding multiplexers 126 to 132, to select the appropriate values at the inputs to those multiplexers 126 to 132 to implement the equations shown in steps 312 and 314. The control variable, i, is incremented by one at step 316. A determination is made at step 318 as to whether or not i is less than 2t, where t=(N−K)/2 for Reed-Solomon (N,K) or BCH(N,K) codes. If the determination at step 318 is positive, processing resumes at step 304. However, if the determination at step 318 is negative, the calculations for the coefficients of the error-locator polynomial, σ(x), are completed.

In a preferred embodiment, the computation of the error-evaluator polynomial, Ω(x), can be calculated directly after the computation of the error-locator polynomial, σ(x). It will be appreciated that t cycles are required to calculate the co-efficients of Ω(x). It will be appreciated that having obtained σ(x), from the key equation, which is $$S(x)\sigma(x)=\Omega(x) \bmod x^{2t},$$

one can derive $$\begin{aligned}\Omega(x) &= S(x)\sigma(x) \bmod x^{2t} \\ &= (S_0+S_1x+\ldots+S_{2t-1}x^{2t-1})\cdot(\sigma_0+\sigma_1x+\ldots+\sigma_tx^t) \bmod x^{2t} \\ &= \Omega_0+\Omega_1x+\ldots+\Omega_{t-1}x^{t-1}.\end{aligned}$$

It will, therefore, be appreciated that $$\Omega_i=S_i\sigma_0+S_{i-1}\sigma_1+\ldots+S_{i-t+1}\sigma_{t-1}, \text{ where } i=0,1,\ldots,t-1.$$

The calculation of $\Omega_i$ is similar to that of $\Delta^{(i)}$. It can be appreciated that the same arrangement shown in FIG. 1 can be used to compute Ω(x) after that arrangement has been used to calculate σ(x). It can be appreciated that $\Omega_i$ can be decomposed as follows $$\Omega_i^{(j)}=S_i\sigma_0, \text{ for } j=0; \text{ and}$$

$$\Omega_i^{(j)}=\Omega_i^{(j-1)}+S_{i-j}\sigma_j, \text{ for } 1\leq j\leq i.$$

Figure 4:
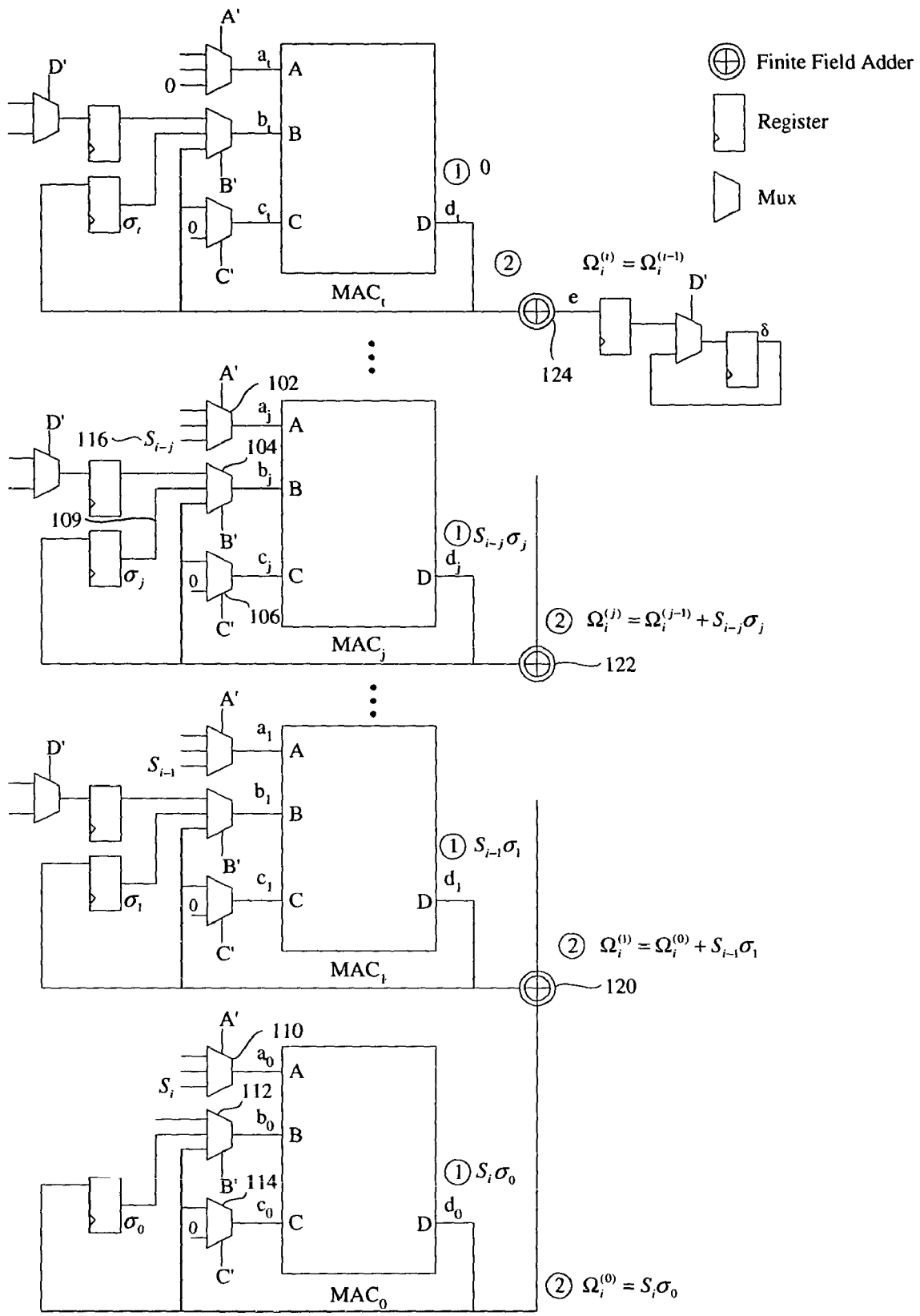
FIG. 4 illustrates the use of the architecture shown in FIG. 1 for calculating the error evaluator polynomial.

Therefore, referring to FIG. 4, the control signal, A', for the first multiplexer 110 is arranged to select the third input, that is, $S_i$, as the input signal, $a_0$, to the lowest order multiply accumulate cell $MAC_0$. The second multiplexer 112 is arranged to select the second input, which bears the signal or data value for $\sigma_0$. Therefore, the second input to the lowest order multiply accumulate cell $MAC_0$ is $\sigma_0$. The control signal, C', for the third multiplexer 114 is arranged to be 0. It will be appreciated that the output signal, $d_0$, will be given by $S_i\sigma_0$, that is, $\Omega_i^{(0)}$. The second multiply and accumulate cell, $MAC_1$, calculates $S_{i-1}\sigma_1$. Therefore, the output of the finite field adder 120 is $\Omega_i^{(1)}=\Omega_i^{(0)}+S_{i-1}\sigma_1$. Similarly, the $j^{th}$ multiply and accumulate cell, $MAC_j$, is arranged to select the third input 116 of the first multiplexer 102 and the second input 109 of the second multiplexer 104 to produce, at the output, $d_j$, the signal or data value $d_j=S_{i-j}\sigma_j$. Hence, the output of the finite field adder 122 is $\Omega_i^{(j)}=\Omega_i^{(j-1)}+S_{i-j}\sigma_j$. The output values of each of the multiply and accumulate cells are shown adjacent to the encircled 1. The encircled "2"s illustrate the progressive accumulation, by the finite field adders 120 to 124, of the $d_0, d_1, \ldots, d_j, \ldots$ and $d_t$ values to produce the overall expression for $$\Omega_i = S_i\sigma_0 + S_{i-1}\sigma_1 + \ldots + S_{i-j}\sigma_j + \ldots + S_{i-t+1}\sigma_{t-1}.$$

It will be appreciated that the calculation of $Q_i$ takes a single clock cycle. Therefore, the overall calculation of $\Omega(x)$ will require t clock cycles since the co-efficients, $\Omega_i$, i= 0, ..., t−1, are calculated in series using the arrangement 400 shown in FIG. 4 with each term, $S_{i-j}\sigma_j$, for $0 \leq j \leq i$, being calculated in parallel using sufficient of the multiply and accumulate cells $MAC_0$ to $MAC_t$.

It can be appreciated that the error-evaluator polynomial computation data flow is as shown in table two below.

TABLE 2

Error-Evaluator Polynomial Computation Data Flow

| step | i | i + 1 |
|---|---|---|
| $a_j$ | $S_{i-j}$ | $S_{i-j+1}$ |
| $b_j$ | $\sigma_j$ | $\sigma_j$ |
| $c_j$ | 0 | 0 |
| $d_j$ | $S_{i-j-1}\sigma_j$ | $S_{i-j}\sigma_j$ |
| e | $\Omega_{i-1}$ | $\Omega_i$ |
| $\sigma_j$ | $\sigma_j$ | $\sigma_j$ |

Therefore, preferred embodiments for implementing the inverse-free Berlekamp-Massey algorithm comprise (t+1) finite field multipliers and require a total of 7t clock cycles to compute the error-locator polynomial and the error-evaluator polynomial. The architecture 100 shown in FIG. 1 can be used for detecting and correcting errors. It can also be applied to the correction of errors and erasures. Since the area of the architecture 100 shown in FIG. 1 is proportional to the number of finite field multipliers, that area is proportional to (t+1). Furthermore, the latency of the architecture 100 shown in FIG. 1 is given by 7t. Therefore, the area-latency product of embodiments is given by $7t^2+7t$, which compares favourably with many fully parallel or fully serial implementations of the inverse-free Berlekamp-Massey algorithm. Still further, it will be appreciated that the architecture 100 shown in FIG. 1 does not require a relatively complex controller.

Figure 5:
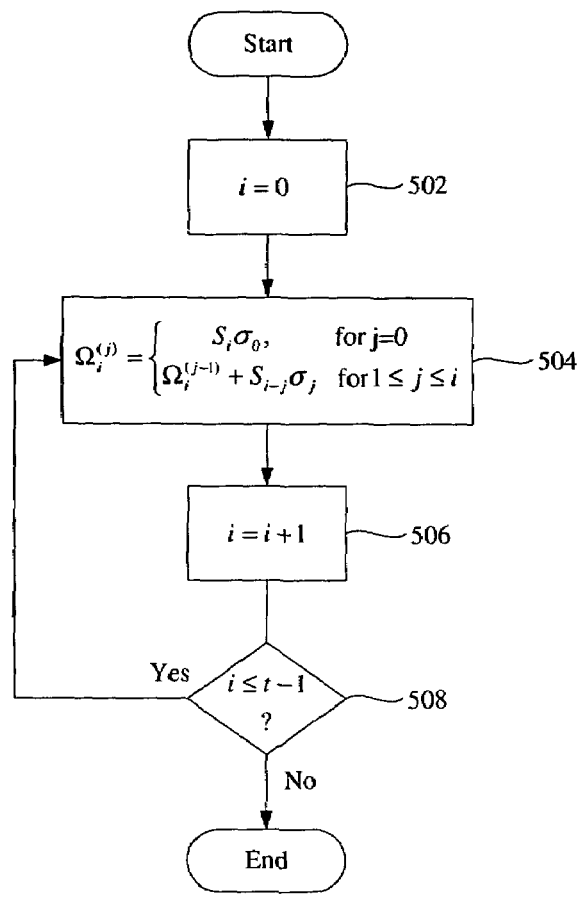
FIG. 5 shows a flowchart for calculating the error-evaluator polynomial.

Referring to FIG. 5, there is shown a flowchart 500 for calculating the error-evaluator polynomial having obtained the error-locator polynomial. The control variable, i, is set to zero at step 502. The expression $$\Omega_i^{(j)} = \begin{cases} S_i\sigma_0, & \text{for } j = 0 \\ \Omega_i^{(j-1)} + S_{i-j}\sigma_j & \text{for } 1 \leq j \leq i \end{cases},$$

is performed at step 504 using as many of the (t+1) multiply accumulate cells $MAC_0$ to $MAC_t$ as is necessary. The control variable, i, is incremented by one at step 506. A determination is made, at step 508, as to whether or not i is less than or equal to t−1. If the determination is positive, processing continues at step 504 where the next co-efficient $\Omega_i$ of $\Omega(x)$ is calculated.

If the determination at step 508 is negative, the calculation of the error-evaluation polynomial is deemed to be complete.

It will be appreciated that the above embodiment can be readily adapted to take into account erasures. For example, if both errors and erasures are to be corrected, the steps are modified to be:

(1) calculate the syndromes and Formey syndromes from the received code words and the erasure locations,
(2) compute the errata locator polynomial and the errata evaluator polynomial,
(3) find the errata locations, and
(4) compute the errata value.

It will be appreciated by those skilled in the art that values of S for undefined subscripts, that is, subscripts that are less than zero, are preferably arranged to be processed as zeros by embodiments of the present invention. It will also be appreciated that this applies equally to calculations relating to both the error locator polynomial and the error evaluator polynomial.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings) and/or all of the steps of any method or process so disclosed may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A data processing system for determining at least one of locations and magnitudes of errors in a received code word via respective coefficients of at least part of one of an error-locator polynomial and an error-evaluator polynomial of degree t in at least part of an inversion-free Berlekamp-Massey algorithm, wherein t is an integer, the system comprising:
a plurality of arithmetic units, each arithmetic unit comprising a finite field multiplier circuit and at least one finite field adder circuit, the finite field multiplier circuit having an output coupled to an input of said at least one finite field adder circuit for selectively performing at least two finite field arithmetic calculations between values associated with said received code word presented at two inputs to the finite field multiplier circuit and a further value associated with said received code word presented at two inputs to the finite field adder circuit, one of said inputs to the finite field adder circuit being coupled to the output of the finite field multiplier circuit and the other of said inputs to the finite field adder circuit being adapted to receive further input data, such that the data processing system includes no more than (t+1) finite field multiplier circuits;
memory for storing a previous finite field arithmetic calculation result of a first arithmetic unit of the plurality of arithmetic units for use in a current finite field arithmetic calculation of the first arithmetic unit; and at least one finite field adder circuit for combining respective finite field arithmetic calculation results of respective current finite field arithmetic calculations of at least two of the arithmetic units.

2. A data processing system as claimed in claim 1 in which a first arithmetic operation of the at least two arithmetic operations comprises a first finite field multiplication operation.

3. A data processing system as claimed in claim 2 in which the first finite field multiplication operation comprises calculating at least a first multiplication of $\delta\sigma^{(i-1)}(x)$ in a first clock cycle, where $\sigma^{(i-1)}(x)$ is an error locator polynomial at step $(i-1)$ and $\delta$ is a previous step discrepancy, wherein i is an integer.

4. A data processing system as claimed in claim 3, wherein the error locator polynomial $\sigma(x)$ is calculated in 6t clock cycles relative to a start of processing of the received code word.

5. A data processing system as claimed in claim 2 in which the finite field arithmetic operation comprises calculating at least a second multiplication operation of $\Delta^{(i)}x\lambda^{(i-1)}(x)$ in a second clock cycle, where $\Delta^{(i)}$ is a step discrepancy at step i and $\lambda^{(i-1)}(x)$ is an auxiliary polynomial at step $(i-1)$, wherein i is an integer.

6. A data processing system as claimed in claim 1 in which a second arithmetic operation of the at least two arithmetic operations comprises a finite field addition operation.

7. A data processing system as claimed in claim 6 in which the finite arithmetic addition operation comprises calculating at least part of $\delta\sigma^{(i-1)}(x)+\Delta^{(i)}x\lambda^{(i-1)}(x)$ as the current finite field arithmetic operation using $\delta\sigma^{(i-1)}(x)$ as at least part of the previous finite field arithmetic operation, where $\sigma^{(i-1)}(x)$ is an error locator polynomial at step $(i-1)$, $\delta$ is a previous step discrepancy, $\Delta^{(i)}$ is a step discrepancy at step i and $\lambda^{(i-1)}(x)$ is an auxiliary polynomial at step $(i-1)$.

8. A data processing system as claimed in claim 1 further comprising the plurality of arithmetic units operable substantially in parallel to calculate respective coefficients of at least part of at least a first polynomial.

9. A data processing system as claimed in claim 8 in which the first polynomial comprises at least where $\delta\sigma^{(i-1)}(x)+\Delta^{(i)}x\lambda^{(i-1)}(x)$, where $\sigma^{(i-1)}(x)$ is an error locator at step $(i-1)$, $\delta$ is a previous step discrepancy, $\Delta^{(i)}$ is a step discrepancy at step $(i-1)$, $\delta$ is a previous step discrepancy, $\Delta^{(i)}$ is a step i and $\lambda^{(i-1)}(x)$ is an auxiliary polynomial at step $(i-1)$.

10. A data processing system as claimed in claim 9, wherein the error locator polynomial $\sigma(x)$ is calculated in 6t clock cycles relative to a start of processing of the received code word.

11. A data processing system as claimed in claim 1 in which the at least two arithmetic calculations comprises a second finite field multiplication operation in a third clock cycle.

12. A data processing system as claimed in claim 11 in which the second finite field multiplication operation comprises calculating at least one coefficient of a second polynomial.

13. A data processing system as claimed in claim 11 in which the second arithmetic operation comprises calculating at least $S_{i-j+1}\sigma_j^{(i)}$, wherein $S_{i-j+1}$ is coefficient i-j+1 of a syndrome polynomial and $\sigma_j^{(i)}$ is a coefficient j of an error locator polynomial at step i.

14. A data processing system as claimed in claim 13 in which the second arithmetic operation comprises calculating at least part of $\Delta^{(i+1)}=S_{i+1}\sigma_0^{(i)}+S_i\sigma_1^{(i)}+\ldots+S_{i-t+1}\sigma_t^{(i)}$, where $\Delta^{(i+1)}$ is a step discrepancy at step $(i+1)$ and $S_i$ is coefficient i of a syndrome polynomial.

15. A data processing system as claimed in claim 1 comprising at least $(t+1)$ such arithmetic units operable substantially in parallel, each unit producing respective coefficients of at least one of a first polynomial, $\sigma^{(i)}(x)=\delta\sigma^{(i-1)}x+\Delta^{(i)}x\lambda^{(i-1)}(x)$, and a step discrepancy, $\Delta^{(i+1)}=S_{i+1}\sigma_0^{(i)}+S_i\sigma_1^{(i)}+\ldots+S_{i-t+1}\sigma_t^{(i)}$, where $\sigma^{(i-1)}(x)$ is an error locator polynomial at step $(i-i)$, $\delta$ is a previous step discrepancy, $\Delta^{(i-1)}(x)$ is a step discrepancy at step i, $\lambda^{(i-1)}(x)$ is an auxiliary polynomial at step $(i-1)$ and $S_i$ is coefficient of a syndrome polynomial.

16. A data processing system as claimed in claim 1 in which the first arithmetic unit is arranged to calculate at least a respective part of at least part of a further polynomial.

17. A data processing system as claimed in claim 16 in which the further polynomial is an error evaluator polynomial.

18. A data processing system as claimed in claim 16 in which calculating the further polynomial comprises calculating $$\Omega(x) = S(x)\sigma(x) \bmod x^{2t}$$
$$= (S_0 + S_1 x + \ldots + S_{2t-1} x^{2t-1}) \cdot (\sigma_0 + \sigma_1 x + \ldots + \sigma_t x^t) \bmod x^{2t}$$
$$= \Omega_0 + \Omega_1 x + \ldots + \Omega_{t-1} x^{t-1}, \text{ where}$$
$$\Omega_i = S_i \sigma_0 + S_{i-1}\sigma_1 + \ldots + S_{i-t+1}\sigma_{t-1}, \text{ where } i = 0, 1, \ldots, t-1,$$

and where $\Omega(x)$ is an error evaluator polynomial, s(x) is a syndrome polynomial and $\sigma(x)$ is an error locator polynomial.

19. A data processing system as claimed in claim 18 wherein $\Omega(x)$ is calculated in t clock cycles relative to a start of processing of the received code word.

20. A data processing system as claimed in claim 16 in which the at least a respective part of at least part of the further polynomial comprises calculating:

$$\Omega_i=\Omega_i^{(t-1)}, \text{ where}$$
$$\Omega_i^{(j)}=S_i\sigma_0, \text{ for } j=0; \text{ and}$$
$$\Omega_i^{(j)}=\Omega^{(j-1)}+S_{i-j}\sigma_j, \text{ for } 1\leq j\leq i,$$

where $\Omega_i$ is coefficient i of an error evaluator polynomial $\Omega(x)$, $S_i$ is coefficient i of a syndrome polynomial $S(x)$ and $\sigma_i$ is coefficient i of an error locator polynomial $\sigma(x)$.

21. A data processing system as claimed in claim 20 wherein $\Omega(x)$ is calculated in t clock cycles relative to a start of processing of the received code word.

22. A data processing system as claimed in claim 1, further comprising $(2t+1)$ finite field adder circuits.

* * * * *